(12) United States Patent
Parekh et al.

(10) Patent No.: US 7,462,534 B2
(45) Date of Patent: Dec. 9, 2008

(54) METHODS OF FORMING MEMORY CIRCUITRY

(75) Inventors: Kunal R. Parekh, Boise, ID (US); Suraj Mathew, Boise, ID (US); Steve Cole, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 227 days.

(21) Appl. No.: 11/196,051

(22) Filed: Aug. 2, 2005

(65) Prior Publication Data

US 2007/0032011 A1  Feb. 8, 2007

(51) Int. Cl.
*H01L 21/8244* (2006.01)
(52) U.S. Cl. ................. 438/241; 438/300; 257/E21.209
(58) Field of Classification Search ................. 438/238, 438/300, 241; 257/E21.209, E21.624, E21.171, 257/E21.659, E27.103, E21.592
See application file for complete search history.

(56) References Cited

U.S. PATENT DOCUMENTS

| | | | |
|---|---|---|---|
| 5,312,768 A * | 5/1994 | Gonzalez | .................... 438/227 |
| 5,874,330 A | 2/1999 | Ahn | |
| 5,939,760 A | 8/1999 | Batra et al. | |
| 6,144,056 A | 11/2000 | Manning | |
| 6,211,026 B1 | 4/2001 | Ahmad | |
| 6,248,622 B1 | 6/2001 | Lee | |
| 6,248,623 B1 | 6/2001 | Chien et al. | |
| 6,258,671 B1 | 7/2001 | Manning | |
| 6,297,531 B2 * | 10/2001 | Armacost et al. | ........... 257/329 |
| 6,344,398 B1 | 2/2002 | Hsu | |
| 6,353,241 B1 | 3/2002 | Manning | |
| 6,403,423 B1 * | 6/2002 | Weybright et al. | .......... 438/279 |
| 6,548,339 B2 | 4/2003 | Manning | |
| 6,803,286 B2 | 10/2004 | Manning | |
| 6,808,992 B1 | 10/2004 | Ko et al. | |
| 6,830,975 B2 * | 12/2004 | Bicksler et al. | .............. 438/265 |
| 6,995,437 B1 * | 2/2006 | Kinoshita et al. | ........... 257/391 |
| 7,071,527 B2 * | 7/2006 | Iwabuchi | ..................... 257/492 |
| 7,081,389 B2 * | 7/2006 | Lee et al. | ..................... 438/275 |

(Continued)

FOREIGN PATENT DOCUMENTS

WO   2006/027366   3/2007

(Continued)

OTHER PUBLICATIONS

US2006/027366, Mar. 23, 2007, Written Opinion.

(Continued)

*Primary Examiner*—Richard A. Booth
(74) *Attorney, Agent, or Firm*—Wells St. John P.S.

(57) ABSTRACT

The invention includes methods of forming memory circuitry. In one implementation, a substrate is provided which has a memory array circuitry area and a peripheral circuitry area. The memory array circuitry area comprises transistor gate lines having a first minimum line spacing. The peripheral circuitry area comprises transistor gate lines having a second minimum line spacing which is greater than the first minimum line spacing. Anisotropically etched insulative sidewall spacers are formed over opposing sidewalls of individual of said transistor gate lines within the peripheral circuitry area prior to forming anisotropically etched insulative sidewall spacers over opposing sidewalls of individual of said transistor gate lines within the memory array area. Other aspects and implementations are contemplated.

39 Claims, 14 Drawing Sheets

U.S. PATENT DOCUMENTS

| | | |
|---|---|---|
| 7,176,109 B2 * | 2/2007 | Ping et al. ............... 438/300 |
| 2001/0053609 A1 * | 12/2001 | Ko ............... 438/706 |
| 2002/0068395 A1 | 6/2002 | Tran et al. |
| 2003/0015746 A1 | 1/2003 | Ida et al. |
| 2003/0025163 A1 | 2/2003 | Kwon |
| 2003/0111688 A1 | 6/2003 | Hokazono |
| 2005/0023605 A1 * | 2/2005 | Amato ............... 257/328 |
| 2005/0051866 A1 | 3/2005 | Wang et al. |

FOREIGN PATENT DOCUMENTS

| | | |
|---|---|---|
| WO | 2006/027366 | 2/2008 |

OTHER PUBLICATIONS

US2006/027366, Mar. 23, 2007, Search Report.

* cited by examiner

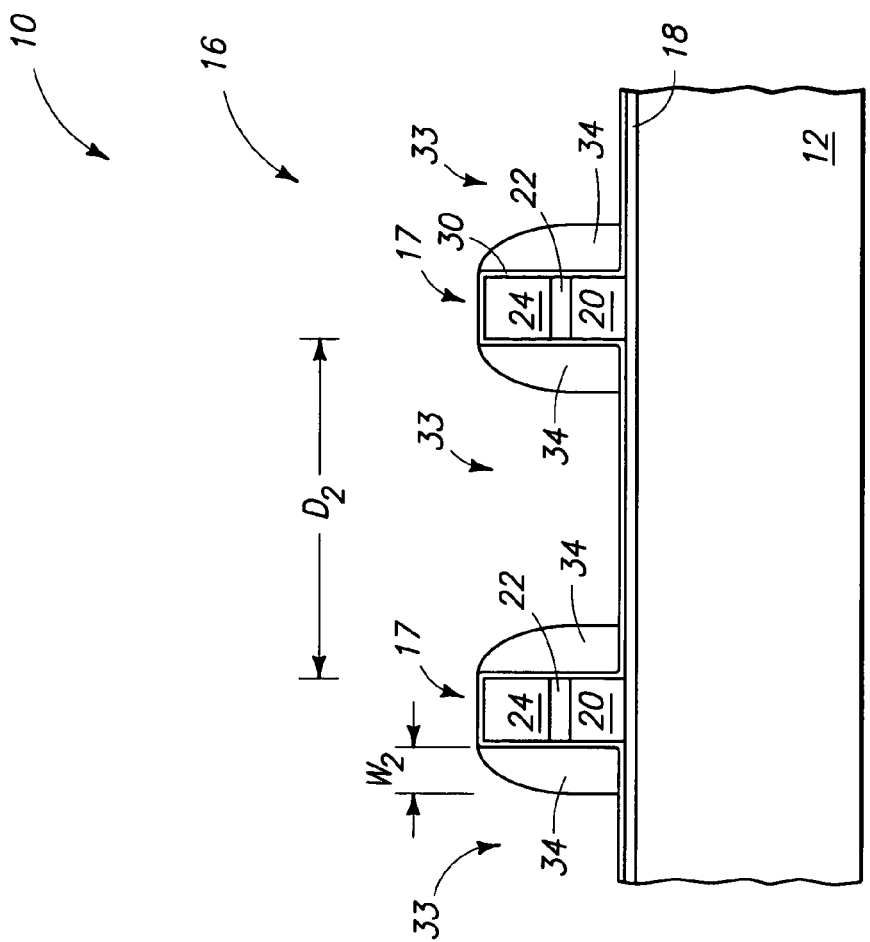
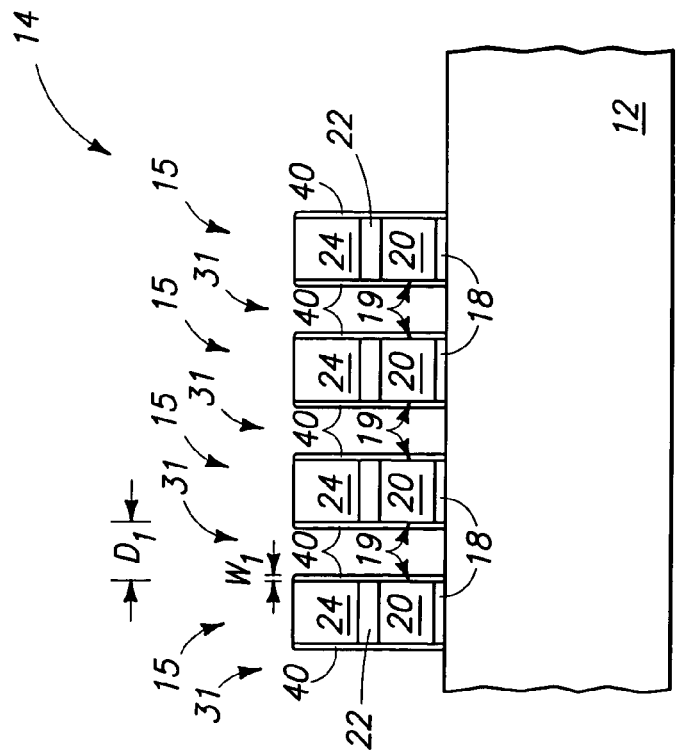

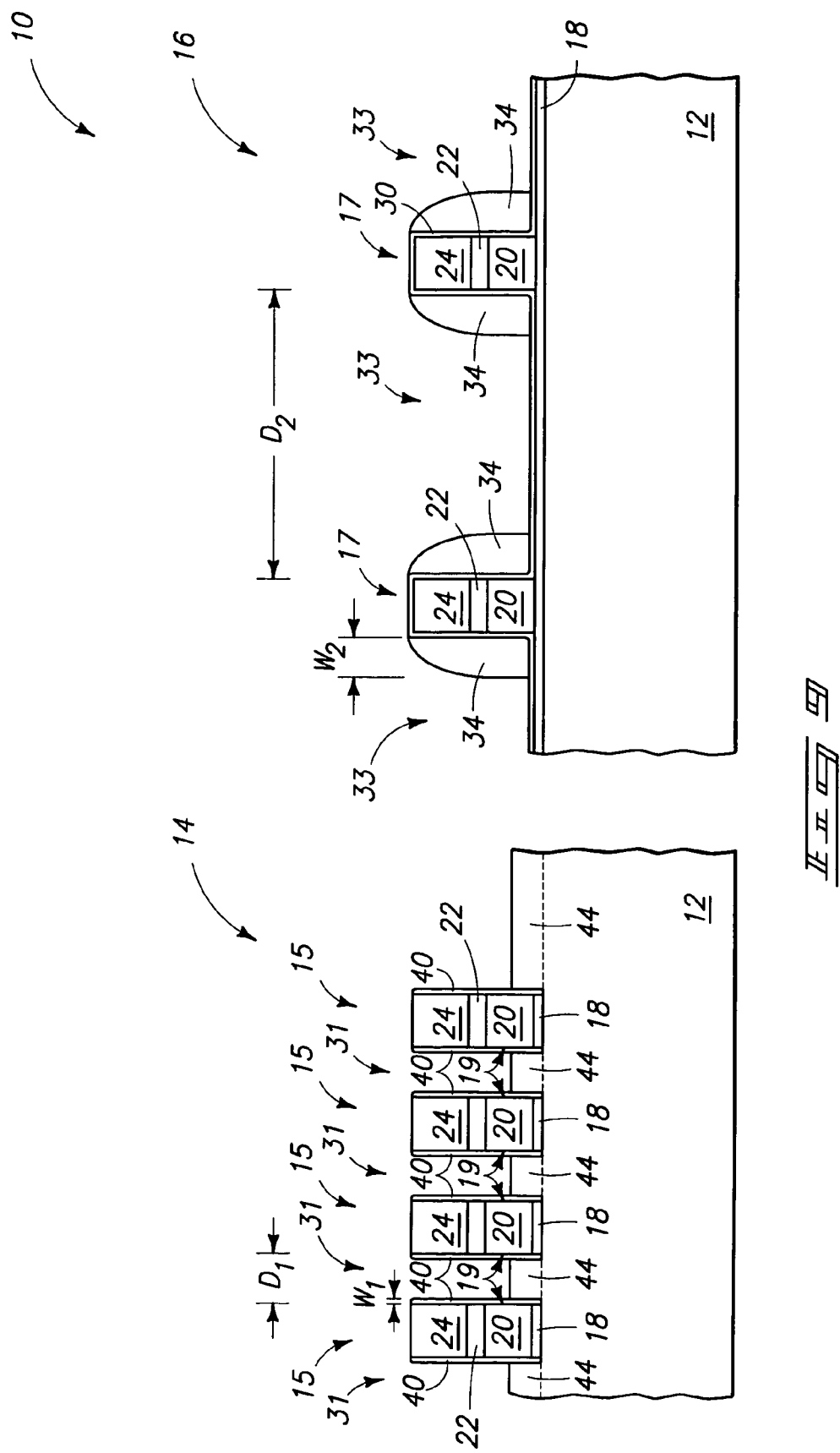

METHODS OF FORMING MEMORY CIRCUITRY

TECHNICAL FIELD

This invention relates to methods of forming memory circuitry.

BACKGROUND OF THE INVENTION

The fabrication of integrated circuitry involves the formation of conductive lines over a substrate. Such conductive lines are used to connect to or with device components. One type of integrated circuitry is memory circuitry. Memory circuitry typically includes a memory array circuitry area in which storage devices are fabricated as close as lithography or other processing allows in order to conserve wafer space. Memory circuitry also typically includes peripheral circuitry in which the spacing requirements are not as paramount as in the memory array. Accordingly in many instances, devices in the peripheral circuitry area are typically spaced further apart relative to devices in the memory array circuitry area.

Transistor gate lines are commonly utilized in memory circuitry and peripheral circuitry. Such lines typically include sidewall spacers which electrically insulate the sides of the transistor gate lines. Such spacers are typically provided by forming a layer of insulative material over the substrate and anisotropically etching the layer to leave spacers about the sidewalls of the transistor gate lines.

The lateral width of spacers within memory arrays continues to get thinner as the distance between adjacent transistor gate lines reduces. Further in some instances, epitaxial semiconductive material, such as monocrystalline silicon, is grown from underlying substrate material as part of the source/drain regions of the transistors formed within the memory array area as well as in the peripheral circuitry area. Such growth is typically optimized for memory array circuitry performance, and requires process modification relative to the peripheral circuitry to achieve the desired operating circuitry in the peripheral circuitry array.

Further, reduction of spacer width within the memory array circuitry area undesirably results in increased parasitic capacitance between the spacers and transistor gates. This can adversely affect the speed and/or other performance characteristics of the individual transistors. Parasitic capacitance is increased or maximized by reducing the thickness of the dielectric between a pair of conductors and/or by increasing the dielectric constant "k" of the dielectric material between such conductors. It would be desirable to develop further methods which enable optimization of anisotropically etched spacer width over transistor gates lines within the memory array circuitry area differently or separately from the formation of such spacers within the peripheral circuitry area.

While the invention was motivated in addressing the above identified issues, it is in no way so limited. The invention is only limited by the accompanying claims as literally worded, without interpretative or other limiting reference to the specification, and in accordance with the doctrine of equivalents.

SUMMARY

The invention includes methods of forming memory circuitry. In one implementation, a substrate is provided which has a memory array circuitry area and a peripheral circuitry area. The memory array circuitry area comprises transistor gate lines having a first minimum line spacing. The peripheral circuitry area comprises transistor gate lines having a second minimum line spacing which is greater than the first minimum line spacing. Anisotropically etched insulative sidewall spacers are formed over opposing sidewalls of individual of said transistor gate lines within the peripheral circuitry area prior to forming anisotropically etched insulative sidewall spacers over opposing sidewalls of individual of said transistor gate lines within the memory array area.

In one implementation, spaces between the transistor gate lines are masked within the memory array circuitry area while forming anisotropically etched insulative sidewall spacers over the transistor gate lines within the peripheral circuitry area and not within said spaces between the transistor gate lines within the memory array circuitry area. Also, spaces between the transistor gate lines within the peripheral circuitry area are masked while forming anisotropically etched insulative sidewall spacers over the transistor gate lines within the memory array circuitry area and not within said spaces between the transistor gate lines within the peripheral circuitry area.

In one implementation, elevated source/drain regions comprising epitaxially grown semiconductive material are formed within spaces between the transistor gate lines within the memory array circuitry area and not within spaces between the transistor gate lines within the peripheral circuitry area.

In one implementation, first insulative spacer material is formed over the transistor gate lines within the memory array circuitry area and the peripheral circuitry area. Second insulative spacer material is formed over the first insulative spacer material and over the transistor gate lines within the memory array circuitry area and the peripheral circuitry area. The second insulative spacer material is selectively etchable relative to the first insulative spacer material. The second insulative spacer material fills spaces between the transistor gate lines within the memory array circuitry area and does not fill spaces between the transistor gate lines within the peripheral circuitry area. The second insulative spacer material is anisotropically etched selectively relative to the first insulative spacer material effective to form insulative sidewall spacers over opposing sidewalls of individual of said transistor gate lines within the peripheral circuitry area. After forming the sidewall spacers within the peripheral circuitry area, the second insulative spacer material is etched selectively relative to the first insulative spacer material within the memory array circuitry area while said sidewall spacers within the peripheral circuitry area are masked. The first insulative spacer material is anisotropically etched effective to form insulative sidewall spacers over opposing sidewalls of individual of said transistor gate lines within the memory array circuitry area.

Other aspects and implementations are contemplated.

BRIEF DESCRIPTION OF THE DRAWINGS

Preferred embodiments of the invention are described below with reference to the following accompanying drawings.

FIG. 8 is a view of the FIG. 7 substrate fragment at a processing step subsequent to that depicted by FIG. 7.

FIG. 9 is a view of the FIG. 8 substrate fragment at a processing step subsequent to that depicted by FIG. 8.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
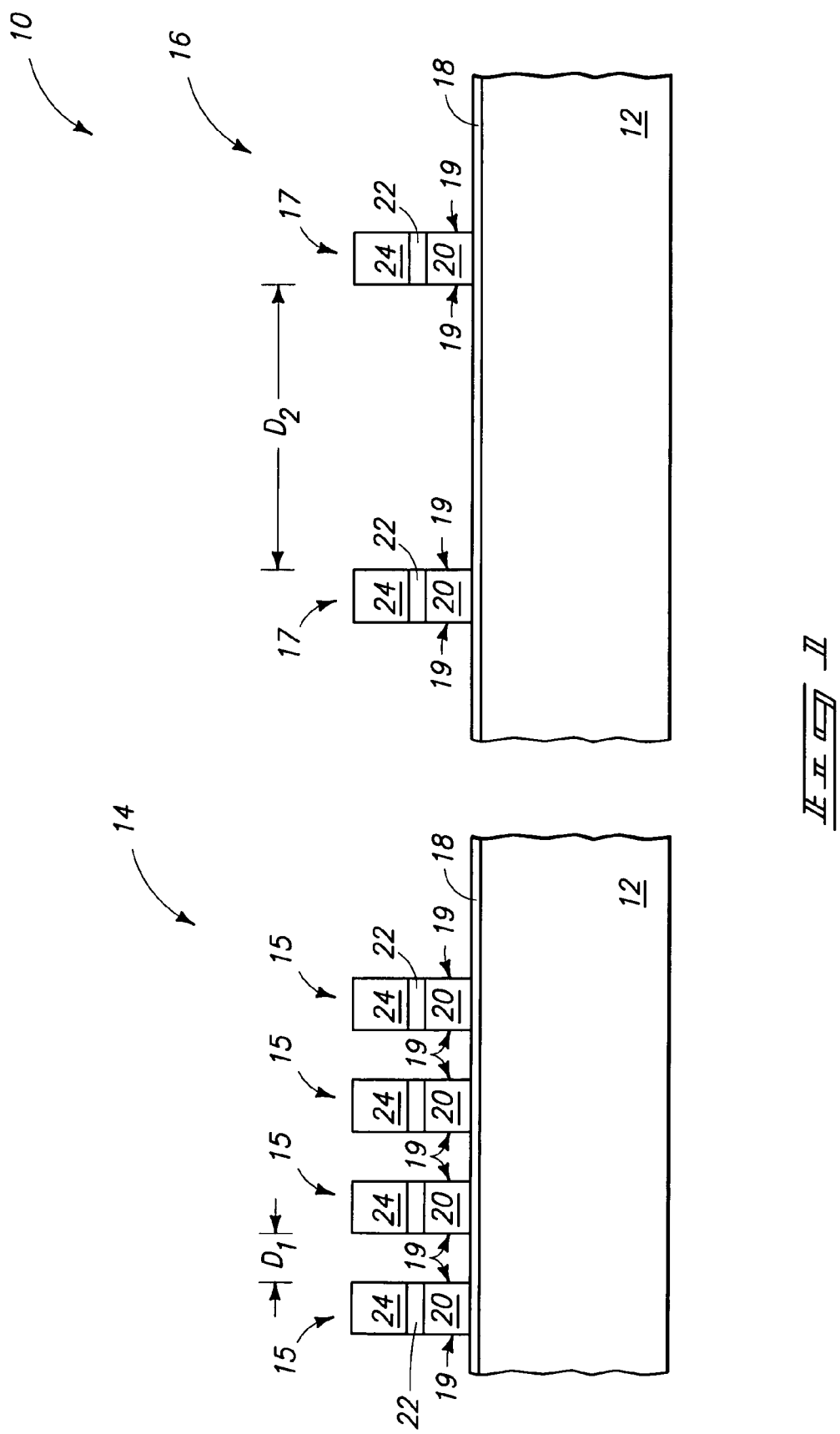
FIG. 1 is a diagrammatic depiction of a substrate fragment in process in accordance with an aspect of the invention.

Exemplary preferred embodiments of various methods of forming memory circuitry are described with reference to FIGS. 1-16. Referring to FIG. 1, a semiconductor wafer fragment in process is indicated generally with reference numeral 10 and includes a semiconductive substrate 12. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. An exemplary preferred semiconductive material of substrate 12 is bulk monocrystalline silicon, although of course other substrates are contemplated, for example semiconductor-on-insulator substrates.

The illustrated substrate 12 includes a memory array circuitry area 14 and a peripheral circuitry area 16. In one preferred implementation, the memory circuitry being fabricated comprises DRAM circuitry. The memory array circuitry area is depicted as comprising some plurality of transistor gate lines 15 having a first minimum line spacing $D_1$. Peripheral circuitry area 16 is depicted as comprising some plurality of transistor gate lines 17 having a second minimum line spacing $D_2$ which is greater than first minimum line spacing $D_1$. A typical line spacing $D_1$ in present-generation processing is 780 Angstroms, and of course is expected to reduce in later-generation processing. An exemplary $D_2$ line spacing for present-generation $D_1$ 780 Angstroms line spacing is from 1,500 Angstroms to 2,000 Angstroms. Individual transistor gate lines 15 and 17 can be considered as having sidewalls 19.

The illustrated transistor gate lines 15 and 17 are depicted as being formed over a gate dielectric layer 18, for example silicon dioxide having a thickness of from 20 Angstroms to 70 Angstroms. Gate lines 15 and 17 are also, by way of example only, depicted as comprising a conductively doped semiconductive material region 20 (i.e., polysilicon), a greater conductivity region 22 (i.e., one or both of a refractory metal and refractory metal silicide), and an overlying insulative cap 24 (i.e., one or both of silicon nitride and silicon dioxide). An exemplary preferred manner of forming the depicted transistor gate line constructions 15 and 17 is by photolithographic patterning and etch, although of course any other manner is contemplated, and whether existing or yet-to-be developed. In one exemplary preferred embodiment, the transistor gate lines relative to which processing of the invention occurs are void of floating gates, and for example wherein the depicted gate lines comprise a singular conductive mass formed by layers 20 and 22.

The substrate of FIG. 1 is preferably subjected to a source/drain reoxidation, and further to various conductivity modifying implants in preferred embodiments. Such implants and other processing are exemplary and preferred only, and do not constitute a part of the invention unless specifically recited in a claim under analysis. Typically and preferably, the memory array circuitry transistors are fabricated to comprise n-channel devices, wherein the peripheral circuitry area is fabricated to comprise a combination of n-channel and p-channel devices. In one preferred implementation, the substrate of FIG. 1 can be subjected to a blanket $L_{DD}$ implant, for example an implant of arsenic to an exemplary dose of $1 \times 10^{12}$ ions/$cm^2$. Further in one preferred embodiment, p-type halo implants can be conducted of the FIG. 1 substrate in n-channel devices by masking p-channel devices, and further might include another $L_{DD}$ implant using arsenic at an exemplary dose of $1 \times 10^{14}$ ions/$cm^2$ for optimizing the n-channel devices. Subsequently or prior thereto, similar processing might be conducted for the p-channel devices. Specifically, the n-channel devices might be masked while a phosphorus or arsenic containing implant is conducted of the p-channel devices for forming halo regions, and perhaps a boron-containing implant is also done for optimizing the $L_{DD}$ regions of p-channel devices.

Figure 2:
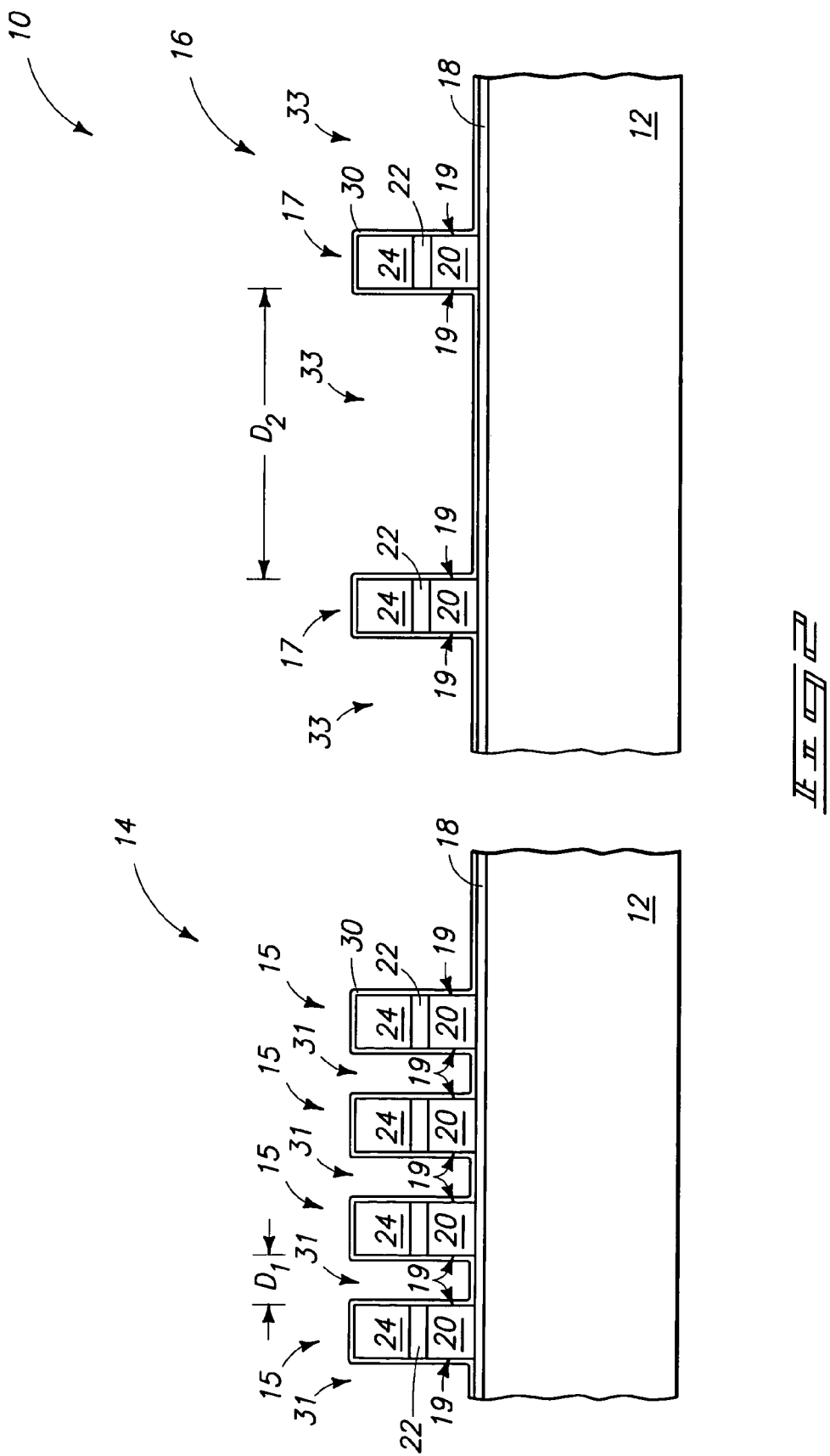
FIG. 2 is a view of the FIG. 1 substrate fragment at a processing step subsequent to that depicted by FIG. 1.

Referring to FIG. 2, a first insulative spacer material 30 is formed over transistor gate lines 15 within memory array circuitry area 14 and over transistor gate lines 17 within peripheral circuitry area 16. Such leaves spaces 31 between transistor gate lines 15 within memory array circuitry area 14, and spaces 33 between transistor gates lines 17 within peripheral circuitry area 16. Exemplary preferred materials include at least one of silicon nitride, aluminum oxide, and hafnium oxide, and of course including mixtures and/or multiple layers thereof. An exemplary preferred thickness range for spacer material 30 is from 50 Angstroms to preferably no greater than one-third of the minimum spacing $D_1$.

Figure 3:
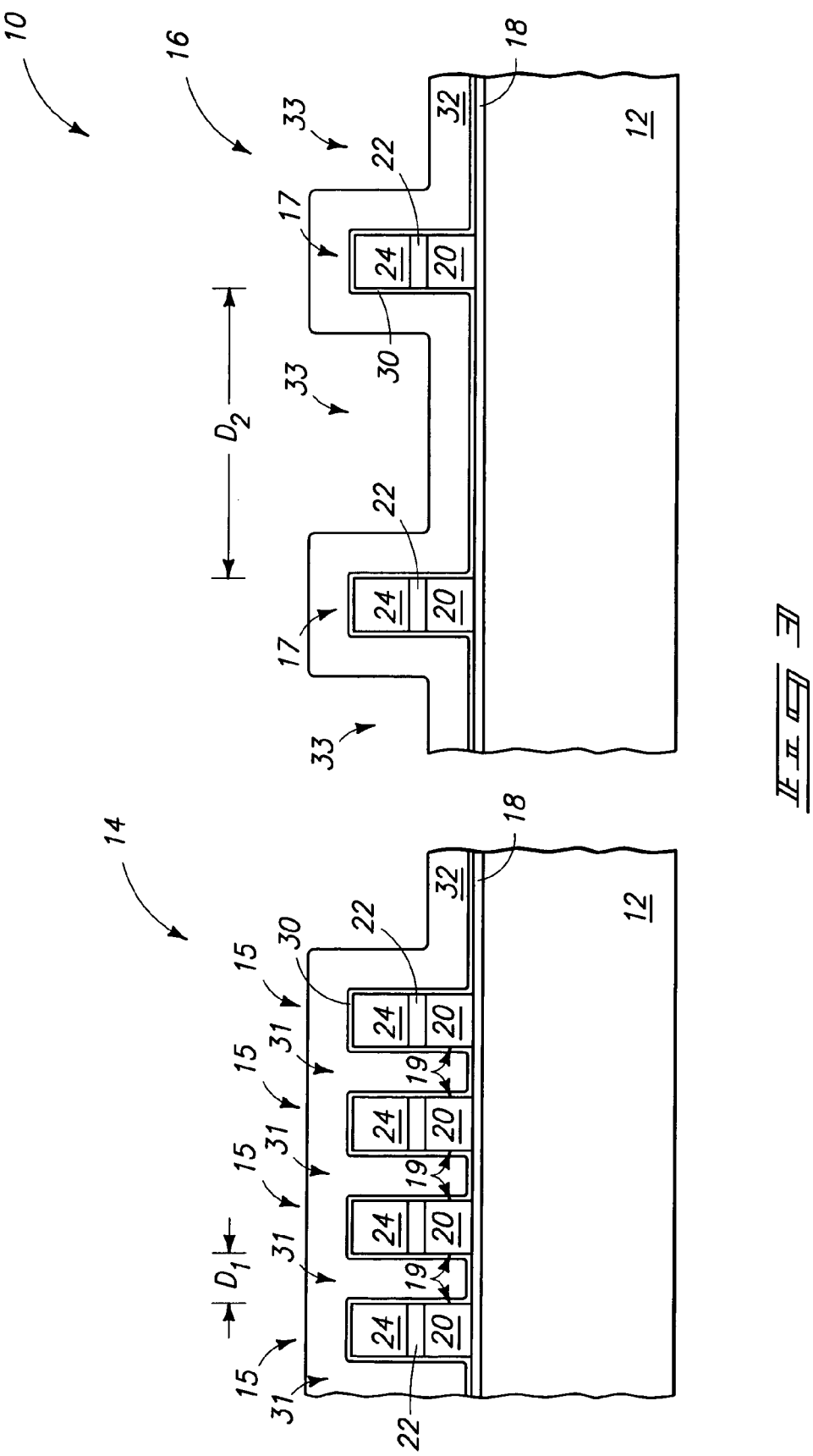
FIG. 3 is a view of the FIG. 2 substrate fragment at a processing step subsequent to that depicted by FIG. 2.

Referring to FIG. 3, a second insulative spacer material 32 has been formed over first insulative spacer material 30 and over transistor gate lines 15 within memory array circuitry area 14 and over transistor gate lines 17 within peripheral circuitry area 16. Second insulative spacer material 32 is advantageously selectively etchable relative to first insulative spacer material 30. Where, for example, first spacer material 30 comprises any one or combination of silicon nitride, aluminum oxide, and hafnium oxide, an exemplary preferred material 32 is undoped silicon dioxide. In the context of this document, "undoped silicon dioxide" defines silicon dioxide material having no greater than one atomic percent of one or a combination of boron and phosphorus. A preferred manner of depositing undoped silicon dioxide 32 is utilizing tetraethylorthosilicate (TEOS), and such that the deposited silicon dioxide is not densified (at least at this point in the process) to facilitate preferred selective wet etching to be described subsequently. In the context of this document, an undoped silicon dioxide layer which is "not densified" is deposited at a temperature at less than 700° C., and only remains "not densified" as long as it is not subsequently exposed to a temperature of at least 700° C. In the depicted preferred embodiment, second insulative spacer material 32 is deposited to a thickness effective to fill spaces 31 between transistor gate lines 15 within memory array circuitry area 14, but not to fill spaces 33 between transistor gate lines 17 within peripheral circuitry area 16. By way of example only, an exemplary preferred thickness for material 32 is from 100 Angstroms to 500 Angstroms.

Figure 4:
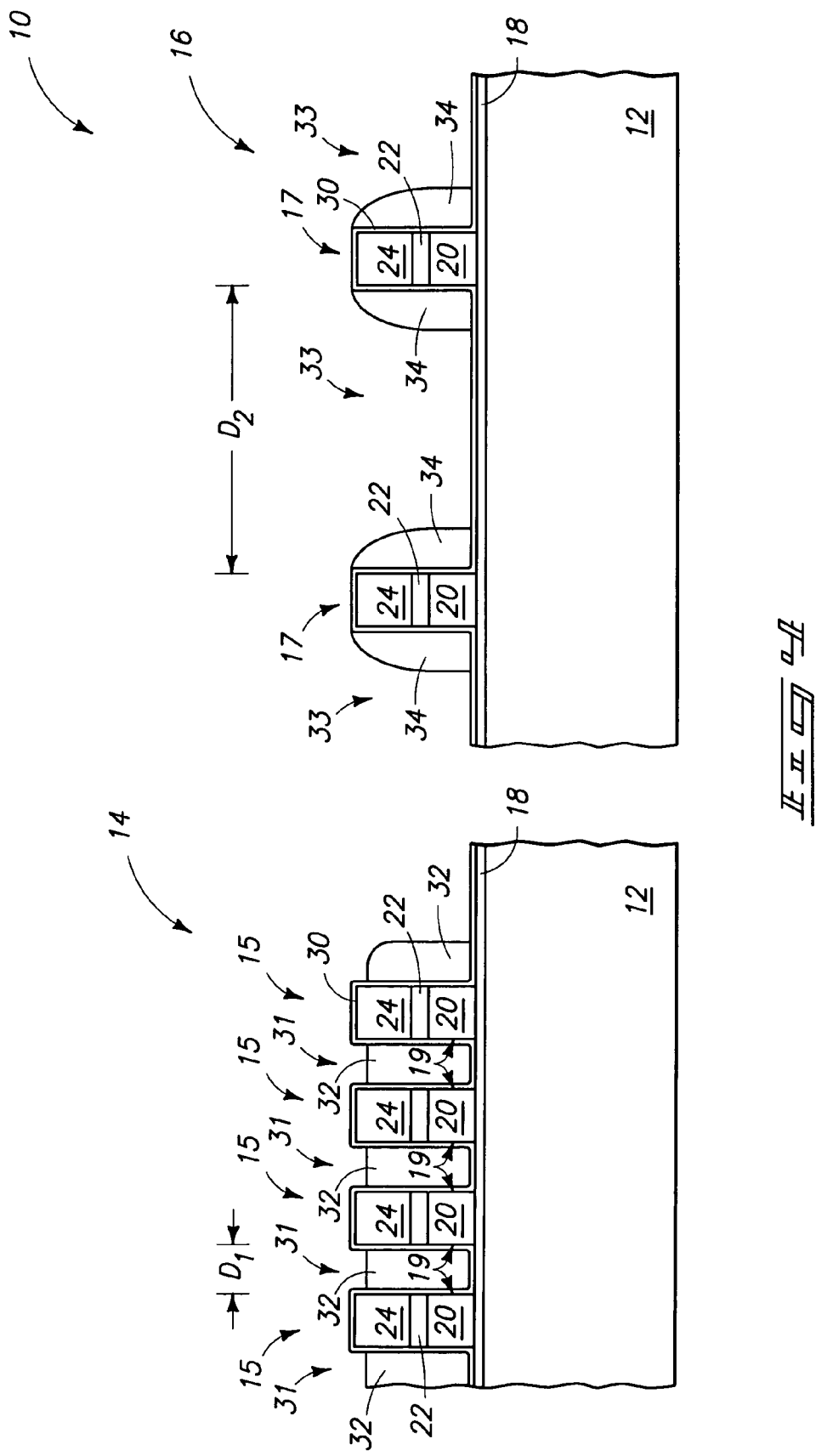
FIG. 4 is a view of the FIG. 3 substrate fragment at a processing step subsequent to that depicted by FIG. 3.

Referring to FIG. 4, second insulative spacer material 32 has been anisotropically etched selectively relative to first insulative spacer material 30 effective to form insulative sidewall spacers 34 over opposing sidewalls 19 of individual of transistor gate lines 17 within peripheral circuitry area 16. An exemplary preferred etching chemistry includes $C_4F_8$, $CF_4$ and Ar for silicon dioxide material received over silicon nitride. In the context of this document, a selective etch requires removal of one material relative to another at a removal rate of at least 2:1.

Figure 5:
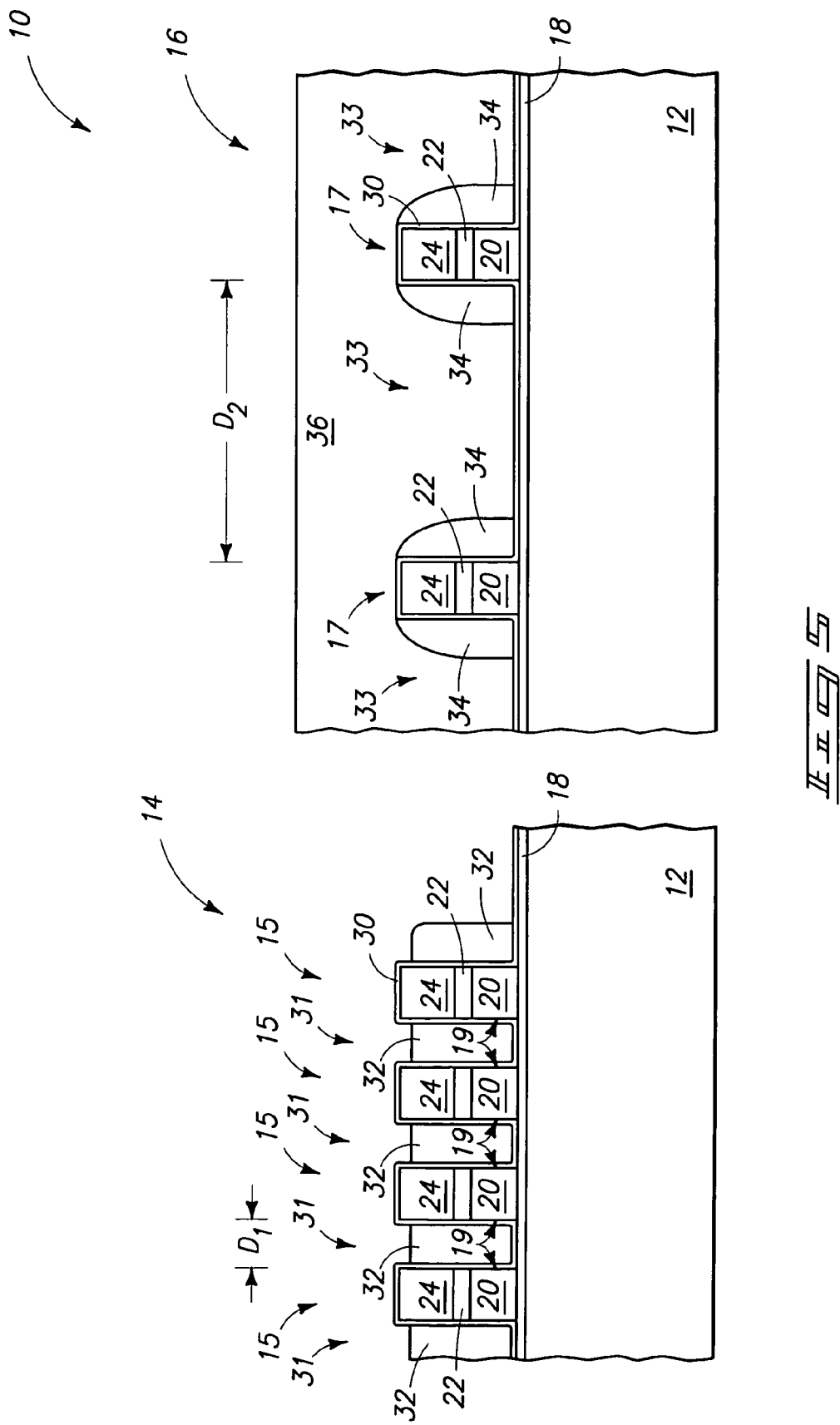
FIG. 5 is a view of the FIG. 4 substrate fragment at a processing step subsequent to that depicted by FIG. 4.

Referring to FIG. 5, sidewall spacers 34 within peripheral circuitry area 16 have been masked. Such is preferably conducted by utilizing a masking layer 36 which masks spaces 33 between transistor gate lines 17 within peripheral circuitry area 16, and further preferably with masking layer 36 masking an entirety of peripheral circuitry area 16. An exemplary preferred material is photoresist, although other materials are also of course contemplated.

Figure 6:
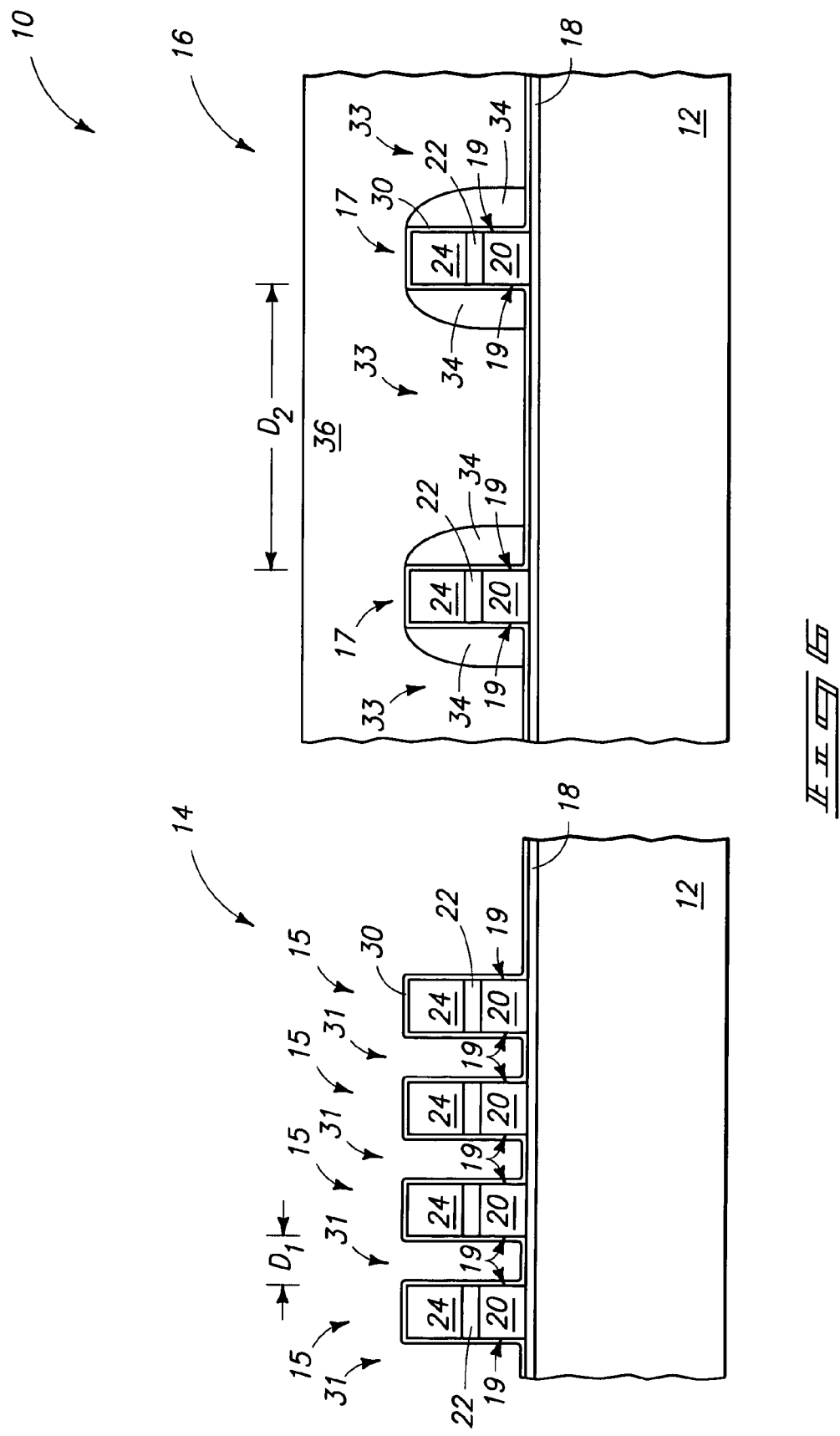
FIG. 6 is a view of the FIG. 5 substrate fragment at a processing step subsequent to that depicted by FIG. 5.

Referring to FIG. 6, second insulative spacer material 32 (not shown) has been etched selectively relative to first insulative spacer material 30 within memory array circuitry area 14, while sidewall spacers 34 of material 32 within peripheral circuitry area 16 are masked. A preferred manner of etching comprises wet etching, for example utilizing a buffered oxide or dilute HF etching chemistry at ambient pressure and at a temperature range of from 20° C. to 100° C. where spacer material 30 comprises undoped silicon dioxide and spacer material 32 comprises silicon nitride. Preferably as described above, and where the spacer material comprises undoped silicon dioxide, such is most preferably not densified if at all or ever until after the etching of the second insulative spacer material as depicted in FIG. 6.

Figure 7:
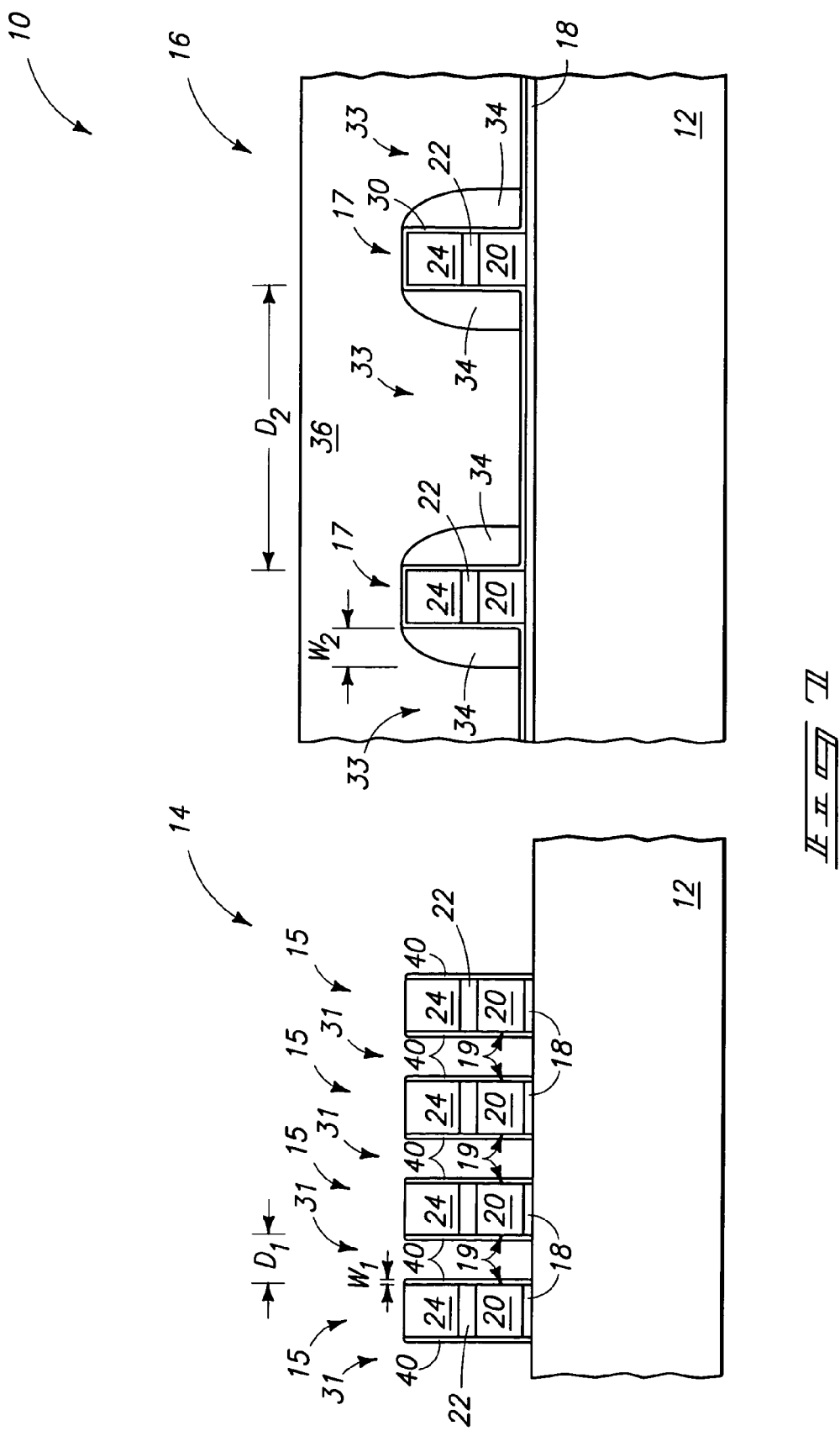
FIG. 7 is a view of the FIG. 6 substrate fragment at a processing step subsequent to that depicted by FIG. 6.

Referring to FIG. 7, first insulative spacer material 30 has been anisotropically etched effective to form insulative sidewall spacers 40 over opposing sidewalls 19 of individual of transistor gate lines 15 within memory array circuitry area 14. An exemplary preferred etching chemistry for such anisotropic etching, where material 30 comprises silicon nitride, includes multistep etching using Ar, $CF_4$, $CH_2F_2$, $CHF_3$ and $O_2$ in a multistep etch process. FIG. 7 also depicts the etching of exposed portions of gate dielectric layer 18 from over substrate 12 effective to expose semiconductive material of semiconductor substrate 12 within memory array circuitry area 14. In the depicted and most preferred examples, insulative sidewalls spacers 34 within peripheral circuitry area 16 have maximum widths $W_2$ which are greater than maximum widths $W_1$ of insulative sidewall spacers 40 within memory array circuitry area 14.

Referring to FIG. 8, masking material 36 (not shown) has been removed from substrate 10.

In one aspect of the invention, the invention encompasses forming anisotropically etched insulative sidewall spacers over the opposing sidewalls of individual of transistor gate lines within the peripheral circuitry area prior to forming anisotropically etched insulative sidewall spacers over the opposing sidewalls of individual of transistor gate lines within the memory array circuitry area. The above-described processing is but one exemplary manner of conducting the same, and any other manner of conducting the same is contemplated, of course, including later-developed methods.

Further, a method of forming memory circuitry in accordance with one aspect of the invention, and independent of order of processing, includes masking the spaces between transistor gate lines within the memory array circuitry area while forming anisotropically etched insulative sidewall spacers over transistor gate lines within the peripheral circuitry area and not within spaces between transistor gate lines within the memory array circuitry area. By way of example, FIG. 4 depicts one such exemplary manner of doing so. Further, continuing in accordance with this aspect of the invention, the spaces between transistor gate lines within the peripheral circuitry area are masked while anisotropically etched insulative sidewall spacers are formed over the transistor gate lines within the memory array circuitry area and not within the spaces between transistor gate lines within the peripheral circuitry area. By way of example only, FIG. 7 depicts one such manner of doing so. Further, the above-described preferred processing conducts the masking within the memory array circuitry area before the masking within the peripheral circuitry area. However, aspects of the invention also encompass masking within the peripheral circuitry area prior to masking within the memory array circuitry area in forming the depicted spacers. For example, and by way of example only, depicted anisotropically etched spacers 40 might be formed prior to the formation of spacers 34.

Further and regardless in the depicted preferred embodiment, the masking which is conducted within the memory array circuitry area while etching to form spacers within the peripheral circuitry area is of all the spaces between the transistor gate lines within the memory array circuitry area. Further in one exemplary preferred embodiment, the masking within the peripheral circuitry area, while anisotropically etching to form insulative sidewall spacers within the memory area circuitry area, is of all spaces between the transistor gate lines within the peripheral circuitry area.

Further, in one exemplary preferred embodiment, the masking within the memory array circuitry area comprises using as a mask a layer (i.e., layer 32) from which the insulative sidewall spacers in the peripheral circuitry area are anisotropically etched, and also in one implementation using as a mask a layer (i.e., layer 30) from which the insulative sidewall spacers in the memory array circuitry area are anisotropically etched.

Further, in the above-described exemplary embodiment, the masking within the memory array circuitry area is void of using photoresist, and in one implementation the masking within the peripheral circuitry area uses photoresist.

Processing might occur subsequently whereby epitaxially grown semiconductive material is formed adjacent the insulative sidewall spacers at least within the memory array circuitry area. For example and by way of example only, the above described and depicted etchings and sequence of spacer formation results in FIG. 8 wherein the semiconductive material of substrate 12 within memory array circuitry area 14 is outwardly exposed, and the semiconductive material of substrate 12 within peripheral circuitry area 16 is covered with materials 30 and 18. Such can be advantageously utilized in one preferred implementation to epitaxially grow semiconductive material adjacent insulative sidewall spacers 40 within memory array circuitry area 14, while not epitaxially growing semiconductive material adjacent insulative sidewall spacers 36 within peripheral circuitry area 16. For example in such instance, the substrate of FIG. 8 is preferably subjected to a cleaning step prior to epitaxial semiconductive material growth, for example exposure to an HF solution for less than 60 seconds at a temperature of 27° C. and atmospheric pressure. An exemplary HF solution is a 100:1 volumetric ratio of water to a 49 weight percent HF solution in water.

Referring to FIG. 9, epitaxial semiconductive material 44 has been grown from semiconductive material of semiconductor substrate 12. One exemplary preferred material is epitaxially grown monocrystalline silicon where the underlying material from which such is grown comprises monocrystalline silicon. Other semiconductive materials are of course contemplated, for example and by way of example only an alloy of gallium and silicon. Materials other than silicon are also of course contemplated. An exemplary thickness for material 44 from the underlying substrate is from 200 Angstroms to 600 Angstroms. An exemplary method of growing such epitaxial semiconductive material 44 of monocrystalline silicon comprises any silane based selective epitaxial growth.

Figure 10:
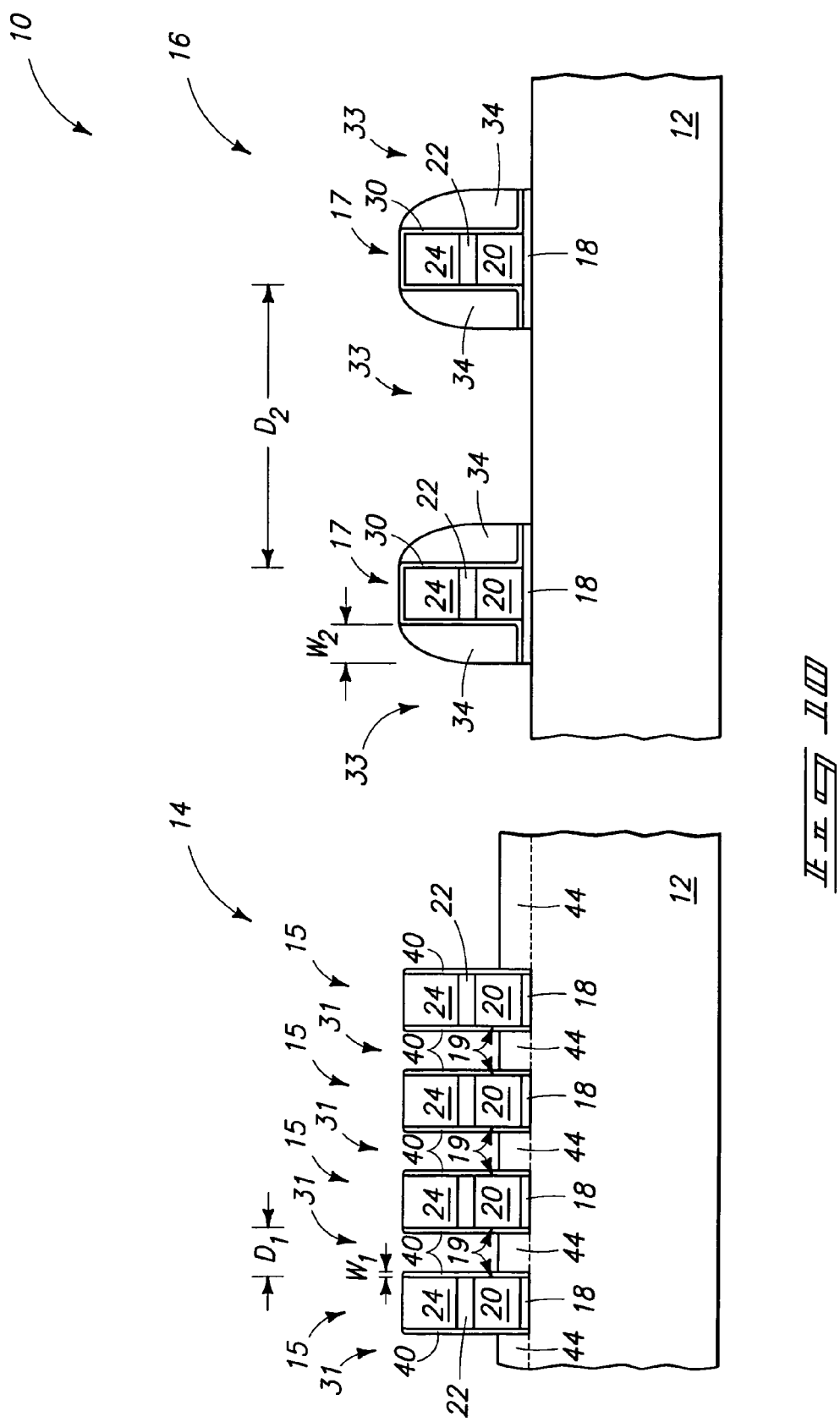
FIG. 10 is a view of the FIG. 9 substrate fragment at a processing step subsequent to that depicted by FIG. 9.

Referring to FIG. 10, exposed material 30, and then exposed material 18, have been etched from peripheral circuitry area 16.

Figure 11:
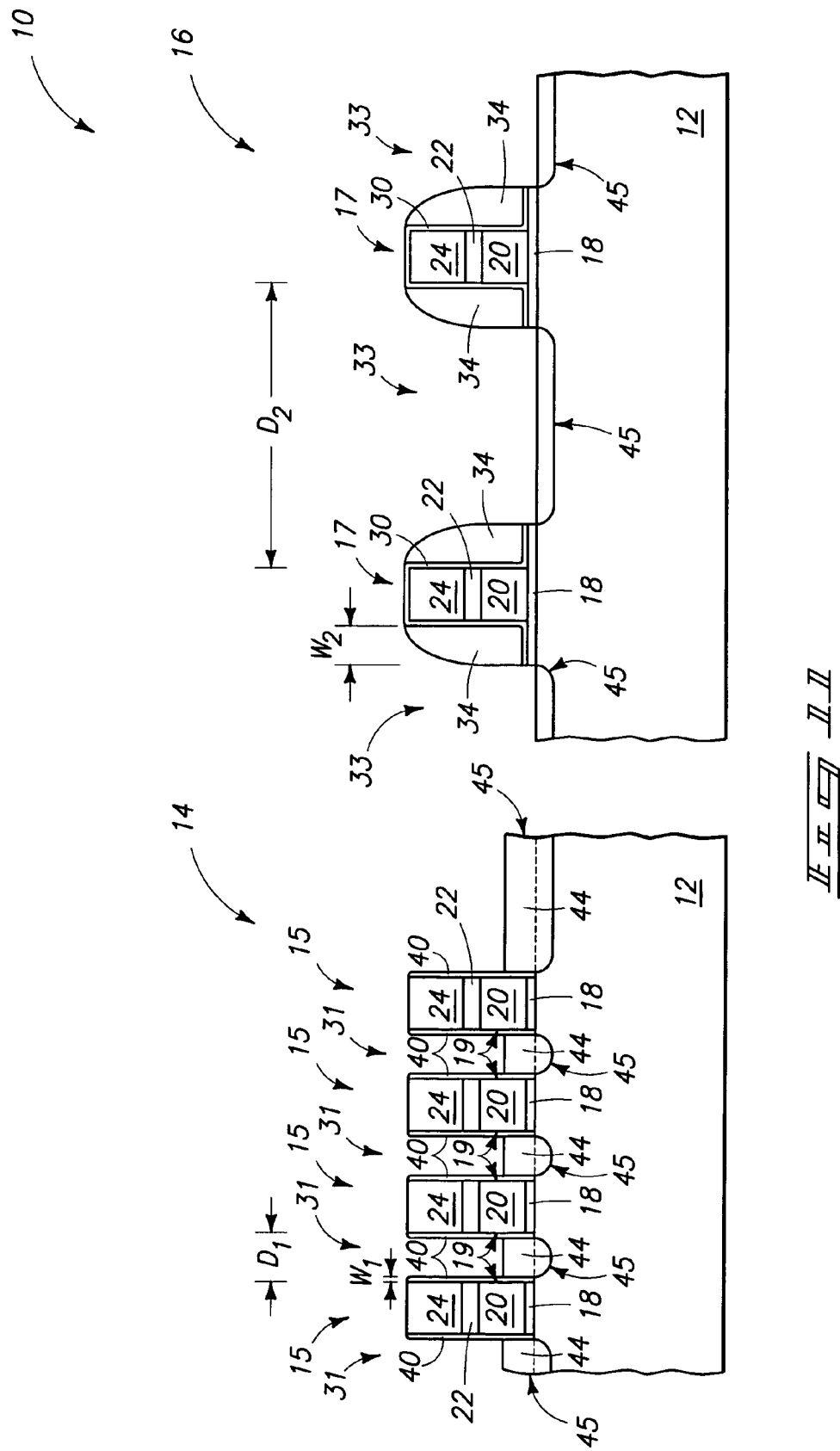
FIG. 11 is a view of the FIG. 10 substrate fragment at a processing step subsequent to that depicted by FIG. 10.

Referring to FIG. 11, suitable implant doping has been conducted to form the desired highest-implant dose source/drain regions 45 for the array and peripheral circuitry. Such might be conducted by any combination of masking and/or implanting steps, and in any exemplary order for the fabrication of typical p-channel devices and n-channel devices in the peripheral circuitry area, and for doping material 44 and substrate material therebeneath. Further, such formation and implanting and masking might occur in any order relative to the preferred removal of materials 30 and 18 over the source/drain areas.

In one exemplary preferred method of forming memory circuitry, for example and by way of example only as described above, an aspect of the invention contemplates forming elevated source/drain regions comprising epitaxially grown semiconductive material within spaces 31 between transistor gate lines within the memory array circuitry area and not within spaces 33 between transistor gates lines within the peripheral circuitry area, for example as shown in FIG. 9. In one exemplary and preferred implementation (and as shown), the epitaxially grown semiconductive material spans the spaces (i.e., spaces 31) between the transistor gate lines within the memory array circuitry area in at least one cross-section, for example the cross-section depicted in FIG. 9. Aspects of the invention include the fabrication of such epitaxially grown semiconductive material independent of spacer formation, and the fabrication as-described above of spacers independent of epitaxial semiconductive material growth. Aspects of the invention also encompass forming the different spacer materials to be of the same, higher, or lower "k" capacitance value than the other, as might be selected and optimized by the artisan.

The above-described exemplary implantings can be conducted at any time, with or without masking, as the artisan will appreciate. By way of example only, and not by way of limitation, processing as described above, in whole or in part, might enable the reduction of parasitic capacitance for various transistors with improved speed performance for a given on/off current target. Preferred processing might also enable the selective formation of epitaxial silicon in either the memory array circuitry area or within the peripheral circuitry area. Further, such can be utilized to optimize spacer width within the memory array circuitry area versus the peripheral circuitry area. Further, by way of example only, thicker peripheral circuitry area spacer spacing enables the source/drain implants to be further away from peripheral channels and also, p+ contacts can have deeper source/drain junctions below them.

Figure 12:
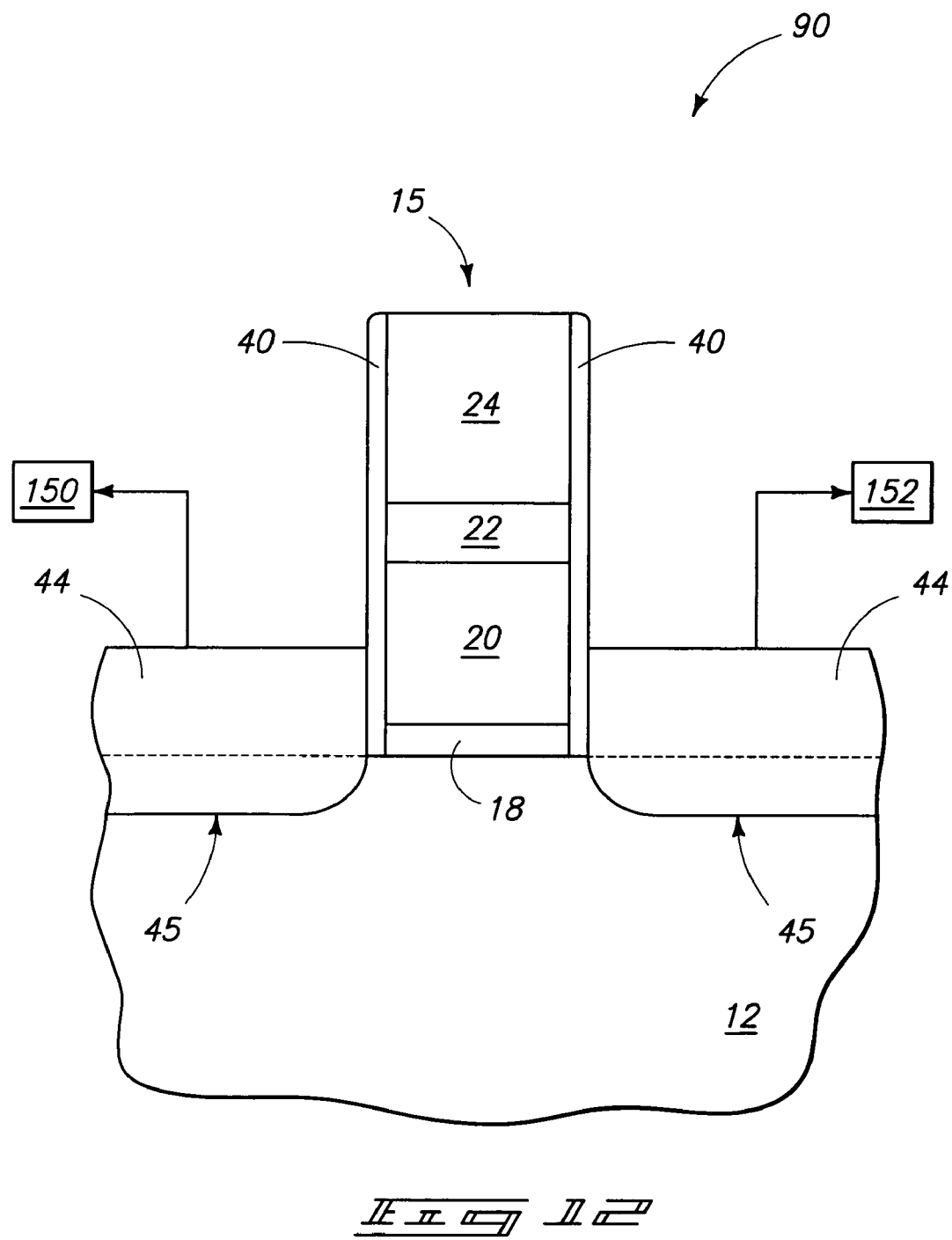
FIG. 12 is a view of a substrate processing in accordance with aspects of the invention.

FIG. 12 depicts one of transistor gate lines 15 incorporated into a DRAM memory cell. Epitaxial semiconductive material 44 comprises source/drain regions of a DRAM memory transistor 90. One of the source/drain regions electrically connects a storage device 150, and the other of the source/drain regions electrically connects to a bitline 152. Storage device 150 can comprise any suitable device, including a capacitor, for example. Bitline 152 can comprise any suitable construction. Feature/transistor 90 can be considered to be part of an integrated circuit, for example the DRAM integrated circuitry just described.

Figure 13:
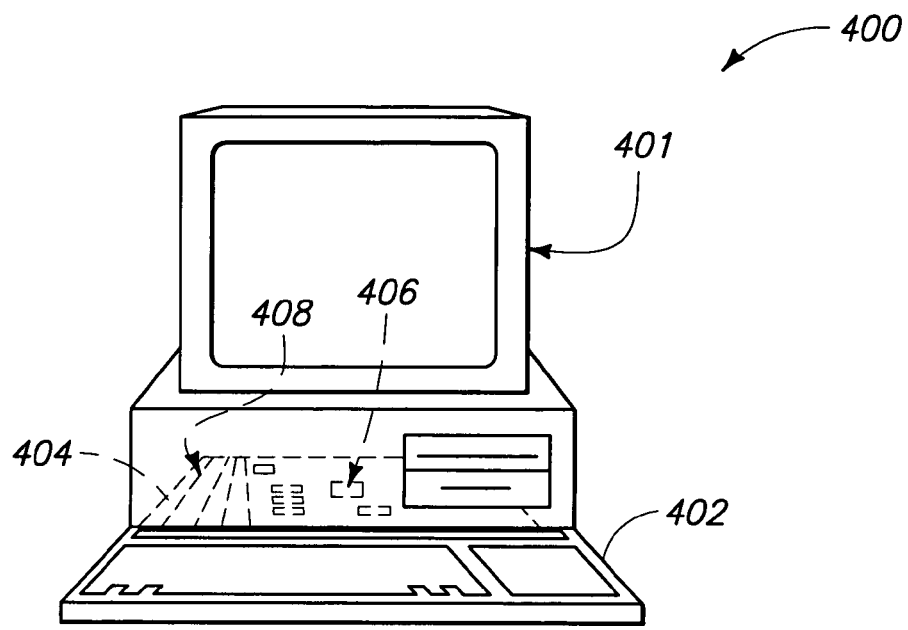
FIG. 13 is a diagrammatic view of a computer illustrating an exemplary application of the present invention.
Figure 14:
FIG. 14 is a block diagram showing particular features of the motherboard of the FIG. 15 computer.

FIG. 13 illustrates generally, by way of example, but not by way of limitation, an embodiment of a computer system 400 according to an aspect of the present invention. Computer system 400 includes a monitor 401 or other communication output device, a keyboard 402 or other communication input device, and a motherboard 404. Motherboard 404 can carry a microprocessor 406 or other data processing unit, and at least one memory device 408. Memory device 408 can comprise various aspects of the invention described above, including, for example, one or more of the wordlines, bitlines and DRAM unit cells. Memory device 408 can comprise an array of memory cells, and such array can be coupled with addressing circuitry for accessing individual memory cells in the array. Further, the memory cell array can be coupled to a read circuit for reading data from the memory cells. The addressing and read circuitry can be utilized for conveying information between memory device 408 and processor 406. Such is illustrated in the block diagram of the motherboard 404 shown in FIG. 14. In such block diagram, the addressing circuitry is illustrated as 410 and the read circuitry is illustrated as 412.

In particular aspects of the invention, memory device 408 can correspond to a memory module. For example, single in-line memory modules (SIMMs) and dual in-line memory modules (DIMMs) may be used in the implementation which utilizes the teachings of the present invention. The memory device can be incorporated into any of a variety of designs which provide different methods of reading from and writing to memory cells of the device. One such method is the page mode operation. Page mode operations in a DRAM are defined by the method of accessing a row of a memory cell arrays and randomly accessing different columns of the array. Data stored at the row and column intersection can be read and output while that column is accessed.

An alternate type of device is the extended data output (EDO) memory which allows data stored at a memory array address to be available as output after the addressed column has been closed. This memory can increase some communication speeds by allowing shorter access signals without reducing the time in which memory output data is available on a memory bus. Other alternative types of devices, by way of example only, include SDRAM, DDR SDRAM, SLDRAM, VRAM and Direct RDRAM, as well as others such as SRAM or Flash memories.

Figure 15:
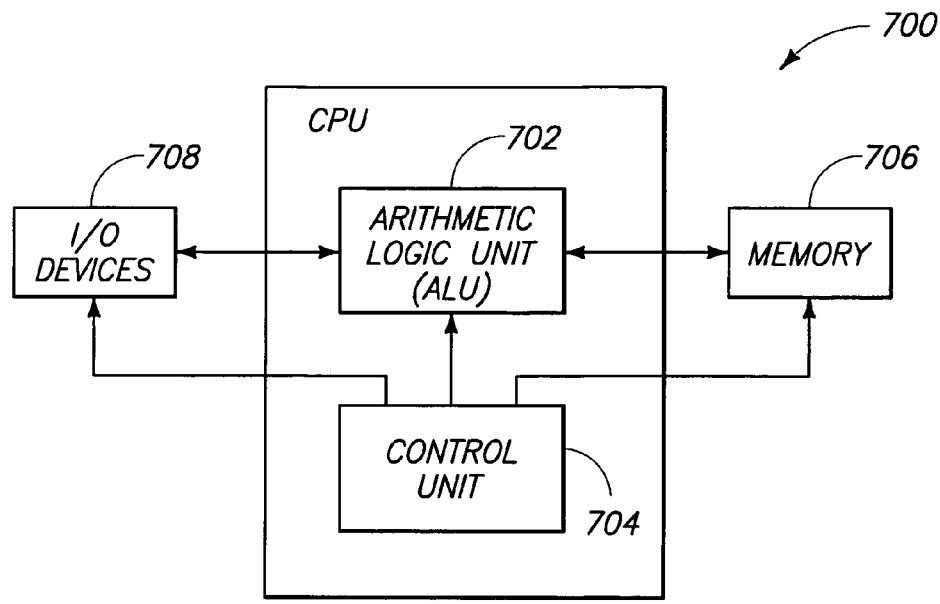
FIG. 15 is a high-level block diagram of an electronic system according to an exemplary aspect of the present invention.

FIG. 15 illustrates a simplified block diagram of a high-level organization of various embodiments of an exemplary electronic system 700 of the present invention. System 700 can correspond to, for example, a computer system, a process control system, or any other system that employs a processor and associated memory. Electronic system 700 has functional elements, including a processor or arithmetic/logic unit (ALU) 702, a control unit 704, a memory device unit 706 and an input/output (I/O) device 708. Generally, electronic system 700 will have a native set of instructions that specify operations to be performed on data by processor 702 and other interactions between processor 702, memory device unit 706 and I/O devices 708. Control unit 704 coordinates all operations of processor 702, memory device 706 and I/O devices 708 by continuously cycling through a set of operations that cause instructions to be fetched from memory device 706 and executed. In various embodiments, memory device 706 includes, but is not limited to, random access memory (RAM) devices, read-only memory (ROM) devices, and peripheral devices such as a floppy disk drive and a compact disk CD-ROM drive. One of ordinary skill in the art will understand, upon reading and comprehending this disclosure, that any of the illustrated electrical components are capable of being fabricated to include DRAM cells, wordlines and bitlines in accordance with various aspects of the present invention.

Figure 16:
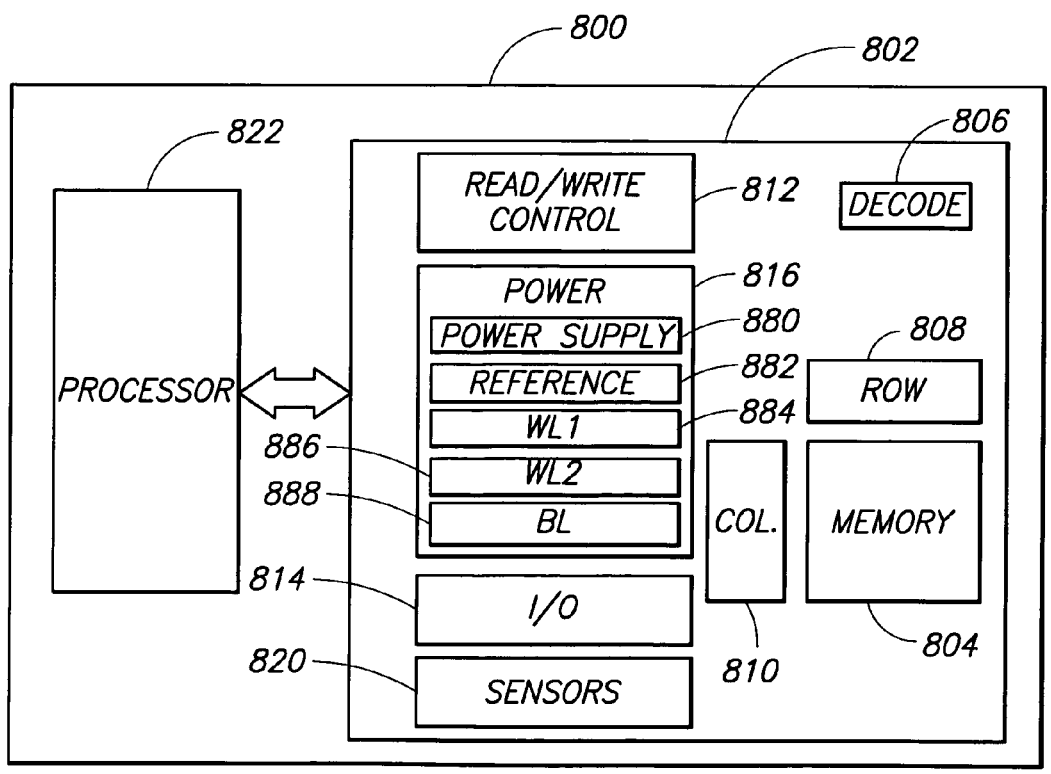
FIG. 16 is a simplified block diagram of an exemplary electronic system according to an aspect of the present invention.

FIG. 16 is a simplified block diagram of a high-level organization of various embodiments of an exemplary electronic system 800. The system 800 includes a memory device 802 that has an array of memory cells 804, address decoder 806, row access circuitry 808, column access circuitry 810, read/write control circuitry 812 for controlling operations, and input/output circuitry 814. Memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing the first wordline with pulses, circuitry 886 for providing the second wordline with pulses, and circuitry 888 for providing the bitline with pulses. System 800 also includes a processor 822, or memory controller for memory accessing.

Memory device 802 receives control signals 824 from processor 822 over wiring or metallization lines. Memory device 802 is used to store data which is accessed via I/O lines. It will be appreciated by those skilled in the art that additional circuitry and control signals can be provided, and that memory device 802 has been simplified to help focus on the invention. At least one of processor 822 or memory device 802 can include a DRAM cell of the type described previously in this disclosure.

The various illustrated systems of this disclosure are intended to provide a general understanding of various applications for the circuitry and structures of the present invention, and are not intended to serve as a complete description of all the elements and features of an electronic system using memory cells in accordance with aspects of the present invention. One of ordinary skill in the art will understand that the various electronic systems can be fabricated in single-package processing units, or even on a single semiconductor chip, in order to reduce the communication time between the processor and the memory device(s).

Applications for memory cells, wordlines and bitlines can include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming memory circuitry, comprising:
   providing a substrate having a memory array circuitry area and a peripheral circuitry area, the memory array circuitry area comprising transistor gate lines having a first minimum line spacing, the peripheral circuitry area comprising transistor gate lines having a second minimum line spacing which is greater than the first minimum line spacing;
   forming anisotropically etched insulative sidewall spacers over opposing sidewalls of individual of said transistor gate lines within the peripheral circuitry area prior to forming anisotropically etched insulative sidewall spacers over opposing sidewalls of individual of said transistor gate lines within the memory array area; and
   after forming said insulative sidewall spacers within the peripheral circuitry area and said insulative sidewall spacers within the memory array circuitry area, epitaxially growing semiconductive material adjacent said insulative sidewall spacers within the memory array circuitry area while not epitaxially growing semiconductive material adjacent said insulative sidewall spacers within the peripheral circuitry area.

2. The method of claim 1 wherein the memory circuitry comprises DRAM circuitry.

3. The method of claim 1 wherein said transistor gate lines within the memory array circuitry area are void of floating gates.

4. The method of claim 1 wherein said insulative sidewall spacers within the memory array circuitry area comprise at least one of silicon nitride, aluminum oxide, and hafnium oxide.

5. The method of claim 1 wherein said insulative sidewall spacers within the peripheral circuitry area comprise undoped silicon dioxide.

6. The method of claim 5 wherein said insulative sidewall spacers within the memory array circuitry area comprise at least one of silicon nitride, aluminum oxide, and hafnium oxide.

7. The method of claim 1 wherein said insulative sidewall spacers within the peripheral circuitry area have maximum widths which are greater than maximum widths of said insulative sidewall spacers within the memory array circuitry area.

8. A method of forming memory circuitry, comprising:
   providing a substrate having a memory array circuitry area and a peripheral circuitry area, the memory array circuitry area comprising transistor gate lines having a first minimum line spacing, the peripheral circuitry area comprising transistor gate lines having a second minimum line spacing which is greater than the first minimum line spacing;
   masking spaces between the transistor gate lines within the memory array circuitry area without using photoresist between the transistor gate lines within the memory array circuitry area while forming anisotropically etched insulative sidewall spacers over the transistor gate lines within the peripheral circuitry area and not within said spaces between the transistor gate lines within the memory array circuitry area; and masking spaces between the transistor gate lines within the peripheral circuitry area while forming anisotropically etched insulative sidewall spacers over the transistor gate lines within the memory array circuitry area and not within said spaces between the transistor gate lines within the peripheral circuitry area.

9. The method of claim 8 wherein said masking within the memory array circuitry area comprises using as a mask a layer from which said insulative sidewall spacers in the peripheral circuitry area are anisotropically etched.

10. The method of claim 8 wherein said masking within the memory array circuitry area comprises using as a mask a layer from which said insulative sidewall spacers in the peripheral circuitry area are anisotropically etched and using as a mask a layer from which said insulative sidewall spacers in the memory array circuitry area are anisotropically etched.

11. The method of claim 8 wherein said masking within the memory array circuitry area occurs before said masking within the peripheral circuitry area.

12. A method of forming memory circuitry, comprising:
providing a substrate having a memory array circuitry area and a peripheral circuitry area, the memory array circuitry area comprising transistor gate lines having a first minimum line spacing, the peripheral circuitry area comprising transistor gate lines having a second minimum line spacing which is greater than the first minimum line spacing;

masking spaces between the transistor gate lines within the memory array circuitry area while forming anisotropically etched insulative sidewall spacers over the transistor gate lines within the peripheral circuitry area and not within said spaces between the transistor gate lines within the memory array circuitry area; and masking spaces between the transistor gate lines within the peripheral circuitry area while forming anisotropically etched insulative sidewall spacers over the transistor gate lines within the memory array circuitry area and not within said spaces between the transistor gate lines within the peripheral circuitry area, the masking within the peripheral circuitry area occurring before said masking within the memory array circuitry area.

13. The method of claim 8 wherein said insulative sidewall spacers within the peripheral circuitry area have maximum widths which are greater than maximum widths of said insulative sidewall spacers within the memory array circuitry area.

14. A method of forming memory circuitry, comprising:
providing a substrate having a memory array circuitry area and a peripheral circuitry area, the memory array circuitry area comprising transistor gate lines having a first minimum line spacing, the peripheral circuitry area comprising transistor gate lines having a second minimum line spacing which is greater than the first minimum line spacing;

forming first insulative spacer material over the transistor gate lines within the memory array circuitry area and the peripheral circuitry area;

forming second insulative spacer material over the first insulative spacer material and over the transistor gate lines within the memory array circuitry area and the peripheral circuitry area, the second insulative spacer material being selectively etchable relative to the first insulative spacer material, the second insulative spacer material filling spaces between the transistor gate lines within the memory array circuitry area and not filling spaces between the transistor gate lines within the peripheral circuitry area;

anisotropically etching the second insulative spacer material selectively relative to the first insulative spacer material effective to form insulative sidewall spacers over opposing sidewalls of individual of said transistor gate lines within the peripheral circuitry area;

after forming said sidewall spacers within the peripheral circuitry area, etching the second insulative spacer material selectively relative to the first insulative spacer material within the memory array circuitry area while said sidewall spacers within the peripheral circuitry area are masked; and anisotropically etching the first insulative spacer material effective to form insulative sidewall spacers over opposing sidewalls of individual of said transistor gate lines within the memory array circuitry area.

15. The method of claim 14 wherein the first insulative spacer material comprises at least one of silicon nitride, aluminum oxide, and hafnium oxide.

16. A method of forming memory circuitry, comprising:
providing a substrate having a memory array circuitry area and a peripheral circuitry area, the memory array circuitry area comprising transistor gate lines having a first minimum line spacing, the peripheral circuitry area comprising transistor gate lines having a second minimum line spacing which is greater than the first minimum line spacing; and forming elevated source/drain regions comprising epitaxially grown semiconductive material within spaces between the transistor gate lines within the memory array circuitry area and not within spaces between the transistor gate lines within the peripheral circuitry area.

17. A method of forming memory circuitry, comprising:
providing a substrate having a memory array circuitry area and a peripheral circuitry area, the memory array circuitry area comprising transistor gate lines having a first minimum line spacing, the peripheral circuitry area comprising transistor gate lines having a second minimum line spacing which is greater than the first minimum line spacing; and forming elevated source/drain regions comprising epitaxially grown semiconductive material within spaces between the transistor gate lines within the memory array circuitry area and not within spaces between the transistor gate lines within the peripheral circuitry area, the epitaxially grown semiconductive material spanning the spaces between the transistor gate lines within the memory array circuitry area in at least one cross section.

18. The method of claim 16 wherein the memory circuitry comprises DRAM circuitry.

19. The method of claim 16 wherein said transistor gate lines within the memory array circuitry area are void of floating gates.

20. The method of claim 17 wherein the memory circuitry comprises DRAM circuitry.

21. The method of claim 14 wherein the first insulative spacer material comprises aluminum oxide.

22. The method of claim 14 wherein the first insulative spacer material comprises hafnium oxide.

23. The method of claim 14 wherein the second insulative spacer material comprises undoped silicon dioxide.

24. The method of claim 23 wherein the undoped silicon dioxide is deposited from TEOS, and is not densified if at all until after said etching of the second insulative spacer material selectively relative to the first insulative spacer material within the memory array circuitry area while said sidewall spacers within the peripheral circuitry area are masked.

25. The method of claim 14 wherein the anisotropically etching of the first insulative spacer material effective to form said insulative sidewall spacers within the memory array circuitry area occurs before the anisotropically etching of the second insulative spacer material effective to form said sidewall spacers within the peripheral circuitry area.

26. The method of claim 14 wherein the memory circuitry comprises DRAM circuitry.

27. The method of claim 14 wherein said transistor gate lines within the memory array circuitry area are void of floating gates.

28. The method of claim 14 comprising after forming said insulative sidewall spacers within the peripheral circuitry area and said insulative sidewall spacers within the memory array circuitry area, epitaxially growing semiconductive material adjacent said insulative sidewall spacers within the memory array circuitry area.

29. The method of claim 14 comprising after forming said insulative sidewall spacers within the peripheral circuitry area and said insulative sidewall spacers within the memory array circuitry area, epitaxially growing semiconductive material adjacent said insulative sidewall spacers within the memory array circuitry area while not epitaxially growing semiconductive material adjacent said insulative sidewall spacers within the peripheral circuitry area.

30. The method of claim 14 wherein the first insulative spacer material has higher "k" than the second insulative spacer material.

31. The method of claim 14 wherein the first insulative spacer material has lower "k" than the second insulative spacer material.

32. The method of claim 14 wherein the first insulative spacer material and the second insulative spacer material have the same "k".

33. The method of claim 14 comprising:
   forming the insulative sidewall spacers over the opposing sidewalls of individual of said transistor gate lines within the peripheral circuitry area to comprise both the first insulative spacer material and the second insulative spacer material; and
   forming the insulative sidewall spacers over the opposing sidewalls of individual of said transistor gate lines within the memory array circuitry area to only comprise the first insulative material.

34. The method of claim 14 wherein the second insulative spacer material is formed over first insulative spacer material that is received over opposing sidewalls of the transistor gate lines in the peripheral circuitry area.

35. The method of claim 14 wherein the anisotropically etching of the second insulative spacer material selectively relative to the first insulative spacer material leaves first insulative spacer material spanning entirely between adjacent transistor gate lines in the peripheral circuitry area.

36. The method of claim 14 wherein the anisotropically etching the first insulative spacer material occurs after said etching of the second insulative spacer material selectively relative to the first insulative spacer material.

37. A method of forming memory circuitry, comprising:
   providing a substrate having a memory array circuitry area and a peripheral circuitry area, the memory array circuitry area comprising transistor gate lines having a first minimum line spacing, the peripheral circuitry area comprising transistor gate lines having a second minimum line spacing which is greater than the first minimum line spacing; and
   forming anisotropically etched insulative sidewall spacers over opposing sidewalls of individual of said transistor gate lines within the peripheral circuitry area prior to forming anisotropically etched insulative sidewall spacers over opposing sidewalls of individual of said transistor gate lines within the memory array area, the insulative sidewall spacers within the peripheral circuitry area comprising undoped silicon dioxide, the insulative sidewall spacers within the memory array circuitry area comprise at least one of aluminum oxide, and hafnium oxide.

38. The method of claim 37 wherein the insulative sidewall spacers within the memory array circuitry area comprise aluminum oxide.

39. The method of claim 37 wherein the insulative sidewall spacers within the memory array circuitry area comprise hafnium oxide.

* * * * *

UNITED STATES PATENT AND TRADEMARK OFFICE
CERTIFICATE OF CORRECTION

PATENT NO.         : 7,462,534 B2                                        Page 1 of 1
APPLICATION NO. : 11/196051
DATED              : December 9, 2008
INVENTOR(S)        : Parekh et al.

It is certified that error appears in the above-identified patent and that said Letters Patent is hereby corrected as shown below:

In column 10, lines 45-47, in Claim 5, delete "The method of claim 1 wherein said insulative sidewall spacers within the peripheral circuitry area comprise undoped silicon dioxide." and insert -- A method of forming memory circuitry, comprising:
 providing a substrate having a memory array circuitry area and a peripheral circuitry area, the memory array circuitry area comprising transistor gate lines having a first minimum line spacing, the peripheral circuitry area comprising transistor gate lines having a second minimum line spacing which is greater than the first minimum line spacing; and
 forming anisotropically etched insulative sidewall spacers over opposing sidewalls of individual of said transistor gate lines within the peripheral circuitry area prior to forming anisotropically etched insulative sidewall spacers over opposing sidewalls of individual of said transistor gate lines within the memory array area, the insulative sidewall spacers within the peripheral circuitry area comprising undoped silicon dioxide. --, therefor.

Signed and Sealed this

Tenth Day of February, 2009

JOHN DOLL
*Acting Director of the United States Patent and Trademark Office*